(12) United States Patent
Chikaishi et al.

(10) Patent No.: US 11,891,692 B2
(45) Date of Patent: Feb. 6, 2024

(54) FILM-FORMING DEVICE

(71) Applicant: Murata Manufacturing Co., Ltd., Nagaokakyo (JP)

(72) Inventors: Yasuhiro Chikaishi, Nagaokakyo (JP); Shigeki Yamane, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 461 days.

(21) Appl. No.: 16/901,566

(22) Filed: Jun. 15, 2020

(65) Prior Publication Data

US 2020/0308700 A1 Oct. 1, 2020

Related U.S. Application Data

(63) Continuation of application No. PCT/JP2018/044922, filed on Dec. 6, 2018.

(30) Foreign Application Priority Data

Dec. 22, 2017 (JP) .................... 2017-246512

(51) Int. Cl.
*C23C 16/455* (2006.01)
*C23C 16/44* (2006.01)
*H01L 21/67* (2006.01)
*H01L 21/673* (2006.01)

(52) U.S. Cl.
CPC .... *C23C 16/45544* (2013.01); *C23C 16/4412* (2013.01); *H01L 21/67155* (2013.01); *H01L 21/67161* (2013.01); *H01L 21/67326* (2013.01)

(58) Field of Classification Search
CPC .......... C23C 16/4588; H01L 21/67313; H01L 21/67326; H01L 21/67754
See application file for complete search history.

(56) References Cited

U.S. PATENT DOCUMENTS

| 4,509,456 | A | * | 4/1985 | Kleinert | ................ C23C 16/455 118/725 |
| 5,178,534 | A | * | 1/1993 | Bayne | ..................... C30B 31/14 432/152 |
| 9,117,862 | B2 | | 8/2015 | Ishizu et al. | |

(Continued)

FOREIGN PATENT DOCUMENTS

| JP | S59107071 A | 6/1984 |
| JP | S59217615 A | 12/1984 |

(Continued)

OTHER PUBLICATIONS

International Search Report issued for PCT/JP2018/044922, dated Feb. 26, 2019.

(Continued)

*Primary Examiner* — Parviz Hassanzadeh
*Assistant Examiner* — Nathan K Ford
(74) *Attorney, Agent, or Firm* — ArentFox Schiff LLP

(57) ABSTRACT

A film-forming device which includes a chamber having a horizontal central axis, capable of maintaining a vacuum, and movable along the horizontal central axis, the chamber including an inner chamber and an outer chamber that houses the inner chamber; a workpiece holder that aligns and holds workpieces to be processed in multiple stages in the inner chamber; and a heater that heats an inside of the chamber.

12 Claims, 6 Drawing Sheets

(56) References Cited

U.S. PATENT DOCUMENTS

| | | |
|---|---|---|
| 2008/0072821 A1 | 3/2008 | Dalton et al. |
| 2009/0297710 A1 | 12/2009 | Lindfors |
| 2011/0318489 A1* | 12/2011 | Ishizu ............... H01L 21/67754 |
| | | 118/500 |
| 2013/0137272 A1 | 5/2013 | Ishibashi et al. |
| 2013/0149874 A1 | 6/2013 | Hirose et al. |
| 2014/0179085 A1 | 6/2014 | Hirose et al. |
| 2015/0087159 A1 | 3/2015 | Kuribayashi et al. |
| 2015/0214014 A1* | 7/2015 | Sato ................... H01L 21/6719 |
| | | 156/345.54 |
| 2016/0365264 A1 | 12/2016 | Tokunobu et al. |
| 2017/0298508 A1 | 10/2017 | Yamakoshi et al. |
| 2018/0286662 A1 | 10/2018 | Nagatomi et al. |
| 2018/0374734 A1 | 12/2018 | Hirano et al. |
| 2019/0267230 A1 | 8/2019 | Harada et al. |
| 2020/0090930 A1 | 3/2020 | Hashimoto et al. |
| 2020/0308700 A1 | 10/2020 | Chikaishi et al. |
| 2020/0308701 A1 | 10/2020 | Chikaishi et al. |
| 2021/0098258 A1 | 4/2021 | Degai et al. |

FOREIGN PATENT DOCUMENTS

| | | |
|---|---|---|
| JP | H01228123 A | 9/1989 |
| JP | H06151346 A | 5/1994 |
| JP | H07230962 A | 8/1995 |
| JP | H0936044 A | 2/1997 |
| JP | H09134913 A | 5/1997 |
| JP | H09148259 A | 6/1997 |
| JP | 2004048068 A | 2/2004 |
| JP | 2009529223 A | 8/2009 |
| JP | 2010186904 A | 8/2010 |
| JP | 2011523444 A | 8/2011 |
| JP | 5221089 B2 | 6/2013 |
| WO | 2015125733 A1 | 8/2015 |

OTHER PUBLICATIONS

Written Opinion of the International Searching Authority issued for PCT/JP2018/044922, dated Feb. 26, 2019.
International Search Report issued for PCT/JP2018/044925, dated Feb. 26, 2019.
Written Opinion of the International Searching Authority issued for PCT/JP2018/044925, dated Feb. 26, 2019.

* cited by examiner

FILM-FORMING DEVICE

CROSS REFERENCE TO RELATED APPLICATIONS

The present application is a continuation of International application No. PCT/JP2018/044922, filed Dec. 6, 2018, which claims priority to Japanese Patent Application No. 2017-246512, filed Dec. 22, 2017, the entire contents of each of which are incorporated herein by reference.

FIELD OF THE INVENTION

The present invention relates to a film-forming device based on atomic layer deposition.

BACKGROUND OF THE INVENTION

Atomic layer deposition (ALD) is known as a method of forming an oxide film on a substrate such as a semiconductor wafer.

Patent Literature 1 (JP 5221089 B) discloses a film-forming device that forms a metal oxide film by ALD. The film-forming device disclosed in Patent Literature 1 includes a processing container having a vertical cylindrical shape and capable of maintaining a vacuum inside the processing container, a holding member that holds objects to be processed in multiple stages in the processing container, a heating device on an outer periphery of the processing container, a deposition material supply mechanism that supplies a deposition material to the processing container, an oxidant supply mechanism that supplies an oxidant to the processing container, a purge gas supply mechanism that supplies a purge gas to the processing container, an exhaust mechanism that exhausts gas in the processing container, and a control mechanism that controls the deposition material supply mechanism, the oxidant supply mechanism, the purge gas supply mechanism, and the exhaust mechanism.

SUMMARY OF THE INVENTION

In the film-forming device disclosed in Patent Literature 1, a wafer board on which wafers as objects to be processed are arranged in multiple stages can be inserted from below into the processing container. During deposition, the wafer board with multiple wafers thereon is loaded into the processing container by being moved upward from below, and the processing container is hermetically sealed.

Then, while the processing container is vacuumed and maintained at a predetermined process pressure, a power supply to the heating device is controlled to increase the temperature of the wafer to maintain a process temperature, and the wafer board is rotated to start deposition in this state.

In the case of a vertical processing container (hereinafter also referred to as a "chamber") as in the film-forming device disclosed in Patent Literature 1, the size of the film-forming device increases in the height direction as the number of objects to be processed (hereinafter also referred to as "workpieces") increases, which makes it difficult to place and remove the workpieces. Further, an increased size of the film-forming device in the height direction creates, for example, the need to search for a building with a higher ceiling. Thus, environments in which the film-forming device can be placed are limited. In addition, maintenance and the like which require a worker to work underneath the chamber is dangerous.

The present invention was made to solve the above problem, and aims to provide a film-forming device that allows workpieces to be easily placed and removed and that is reduced in size in the height direction.

The film-forming device of the present invention is a film-forming device based on atomic layer deposition, which includes a chamber having a horizontal central axis, capable of maintaining a vacuum, and movable along the horizontal central axis, the chamber including an inner chamber and an outer chamber that houses the inner chamber; a workpiece holder that aligns and holds workpieces to be processed in multiple stages in the inner chamber; and a heater that heats an inside of the chamber.

Preferably, the film-forming device of the present invention further includes a control mechanism for controlling a pressure in the outer chamber to be higher than a pressure in the inner chamber.

In the film-forming device of the present invention, preferably, the workpiece holder aligns and holds the workpieces in multiple stages such that main surfaces of the workpieces are oriented in a vertical direction relative to the central axis of the chamber.

In the film-forming device of the present invention, preferably, the workpiece holder is constructed so as to be removably placed into and out of the inner chamber.

In the film-forming device of the present invention, preferably, the heater is removably attached to an outer wall of the inner chamber.

In the film-forming device of the present invention, preferably, the inner chamber is separately removable from the outer chamber, and is further horizontally pivotable relative to the outer chamber when separated therefrom.

The present invention provides a film-forming device that allows workpieces to be easily placed and removed and that is reduced in size in the height direction.

DETAILED DESCRIPTION OF THE PREFERRED EMBODIMENTS

The film-forming device of the present invention is described below.

The present invention is not limited to the following preferred embodiments, and may be suitably modified without departing from the gist of the present invention. Combinations of two or more preferred features described in the following preferred features are also within the scope of the present invention.

The term "horizontally" as used herein does not necessarily refer to a strict horizontal direction. For example, the term includes a direction inclined by about ±10° relative to the horizontal direction. Similarly, the term "vertically" as used herein does not necessarily refer to a strict vertical direction. For example, the term includes a direction inclined by about ±10° relative to the vertical direction.

The film-forming device of the present invention is a film-forming device based on atomic layer deposition (ALD). The film-forming device includes a chamber capable of maintaining a vacuum, a workpiece holder that aligns and holds workpieces to be processed in multiple stages in the chamber, and a heater that heats the inside of the chamber. The film-forming device of the present invention further includes a gas supply mechanism that supplies various gases into the chamber, and an exhaust mechanism that exhausts gas from the chamber. Preferably, the film-forming device of the present invention further includes a rotation mechanism to rotate the workpiece holder.

Figure 1:
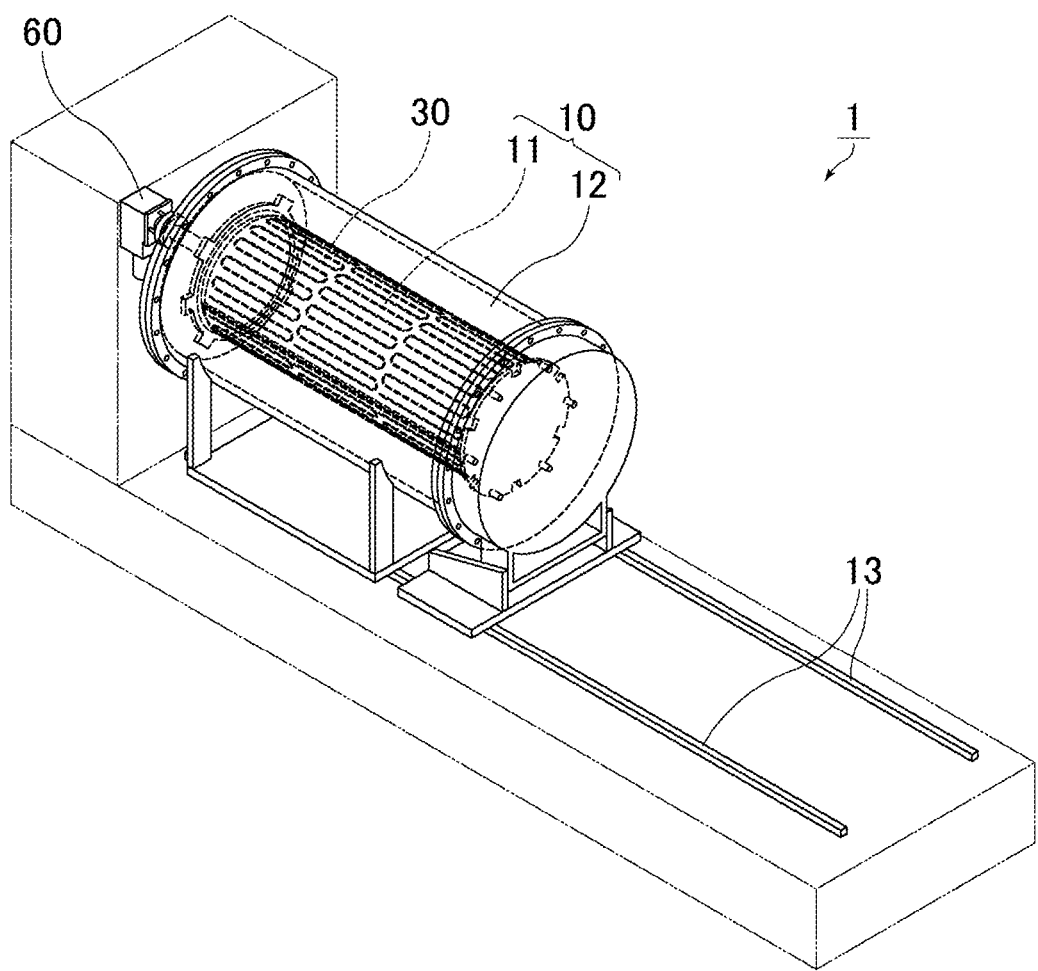
FIG. 1 is a schematic perspective view of a film-forming device according to an embodiment of the present invention.
Figure 2:
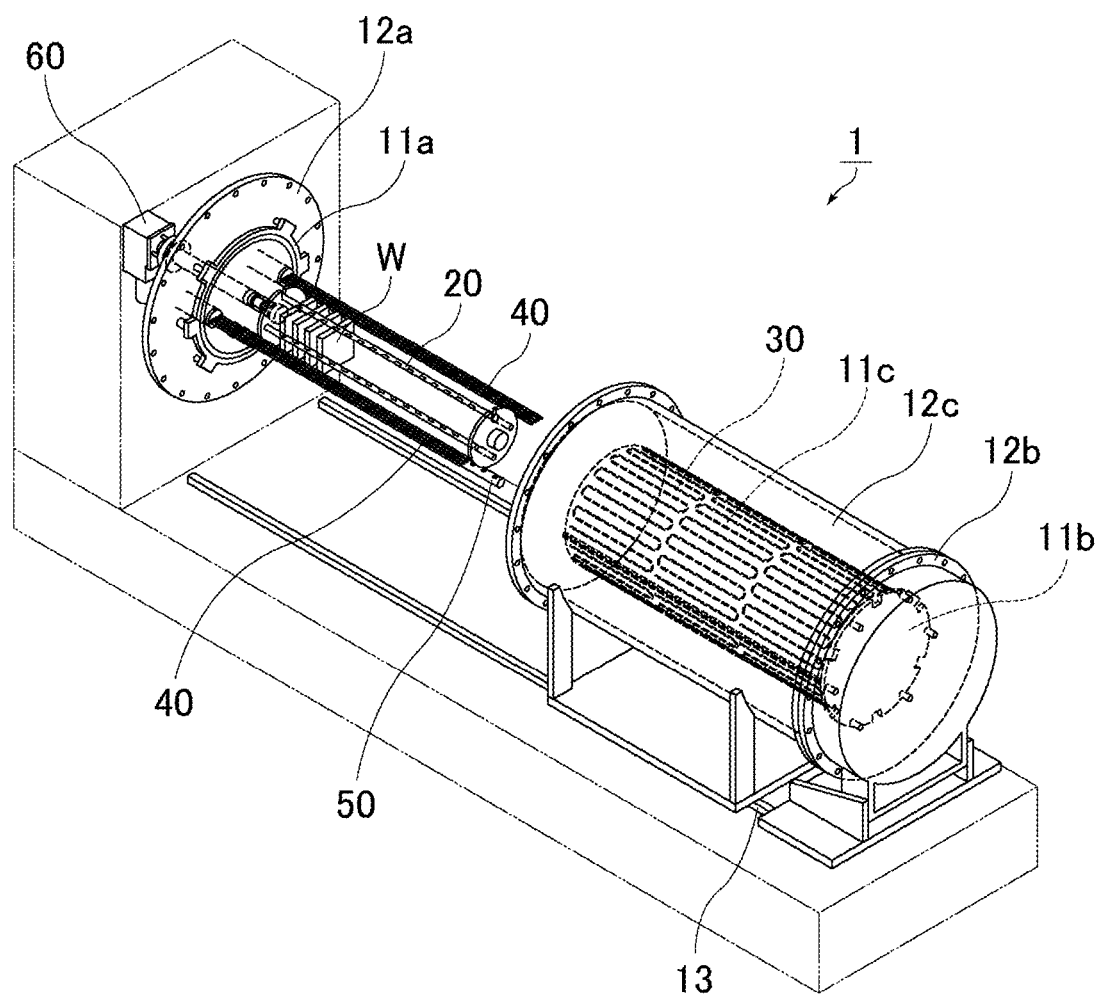
FIG. 2 is a schematic perspective view of a state in which a chamber is open in the film-forming device shown in FIG. 1.

FIG. 1 is a schematic perspective view of a film-forming device according to an embodiment of the present invention. FIG. 2 is a schematic perspective view of a state in which a chamber is open in the film-forming device shown in FIG. 1.

A film-forming device 1 shown in FIG. 1 and FIG. 2 includes a chamber 10 capable of maintaining a vacuum therein, a workpiece holder 20 that aligns and holds workpieces W in multiple stages in the chamber 10, and a heater 30 that heats the inside of the chamber 10. The film-forming device 1 further includes a gas supply pipe group 40 that supplies various gases into the chamber 10, an exhaust pipe 50 that exhausts gas from the chamber 10, and a rotation mechanism 60 to rotate the workpiece holder 20.

In the film-forming device of the present invention, the chamber has its central axis aligned horizontally and preferably is a cylindrical body. In FIG. 1, the chamber 10 includes an inner chamber 11 in which the workpiece holder 20 (see FIG. 2) is placed and an outer chamber 12 that houses the inner chamber 11.

In FIG. 2, the inner chamber 11 includes a first lid 11a defining one side of the cylindrical body, a second lid 11b defining the other side of the cylindrical body, and a chamber body 11c defining a peripheral surface of the cylindrical body. The first lid 11a is fixed to the film-forming device 1, and the second lid 11b is removably connected to a flange of the chamber body 11c. The chamber body 11c is removably connected to the first lid 11a, and is movable horizontally along with the second lid 11b (see FIG. 2).

Similarly, the outer chamber 12 includes a first lid 12a defining one side of the cylindrical body, a second lid 12b defining the other side of the cylindrical body, and a chamber body 12c defining the peripheral surface of the cylindrical body. The first lid 12a is fixed to the film-forming device 1, and the second lid 12b is removably connected to a flange of the chamber body 12c. The chamber body 12c is removably connected to the first lid 12a, and is movable horizontally along with the second lid 12b (see FIG. 2).

The film-forming device 1 includes a guide 13. The second lid 11b and the chamber body 11c of the inner chamber 11 are movable horizontally on the guide 13 along with the second lid 12b and the chamber body 12c of the outer chamber 12 by the driving of a motor (not shown). The driving is stopped after these members are moved to predetermined positions, whereby the chamber 10 is opened.

As described above, when the chamber is a horizontal type and is movable horizontally, it provides enough space so that the workpieces can be easily placed and removed. Even when the number of workpieces is large, the size of the film-forming device can be reduced in the height direction. Thus, environments in which the film-forming device can be placed are less limited.

The phrase that "the chamber is movable horizontally" includes not only a case where the chamber is entirely movable horizontally but also a case where a portion of the chamber is fixed to the film-forming device. Thus, in FIG. 2, both the inner chamber and the outer chamber are considered to be movable horizontally.

In addition, the chamber including the inner chamber and the outer chamber can reduce or prevent leakage of harmful gases such as a deposition gas containing a deposition material or a modifier. As a result, a deposition gas atmosphere in the chamber is stabilized.

Although not shown in FIG. 1 and FIG. 2, preferably, the film-forming device of the present invention further includes a control mechanism that performs control such that the pressure in the outer chamber is higher than the pressure in the inner chamber.

When the pressure in the outer chamber is higher than the pressure in the inner chamber, the gas is less likely to flow from the inner chamber to the outer chamber, which provides safety during deposition, and reduces or prevents attachment of the deposition material or the like to an inner surface of the outer chamber.

The pressure in the outer chamber can be made higher than the pressure in the inner chamber by, for example, controlling the emission and gas supply in the outer chamber and the inner chamber separately while the chamber is closed.

In the film-forming device of the present invention, preferably, the workpiece holder is removably placed in the inner chamber. In FIG. 2, the workpiece holder 20 is removably connected to the first lid 11a of the inner chamber 11. The workpiece holder 20 is not connected to the second lid 11b of the inner chamber 11, and is thus cantilever-supported by the first lid 11a. The workpiece holder may be directly placed in the chamber or may be placed via a support jig fixed in the chamber.

The direction in which the workpiece holder holds the workpieces is not limited. Yet, as shown in FIG. 2, preferably, the workpiece holder aligns and holds workpieces in multiple stages such that main surfaces of the workpieces are oriented vertically relative to the central axis of the chamber. In this case, these workpieces are arranged so as to be spaced apart from each other, with their main surfaces opposing each other.

When deposition is performed on workpieces arranged with their main surfaces oriented vertically, particles as impurities are less likely to remain on the main surfaces of the workpieces. In addition, there is no risk of the workpieces falling from an upper portion of the chamber as compared to the case where the workpieces are stacked vertically. Thus, work can be performed safely.

Figure 3:
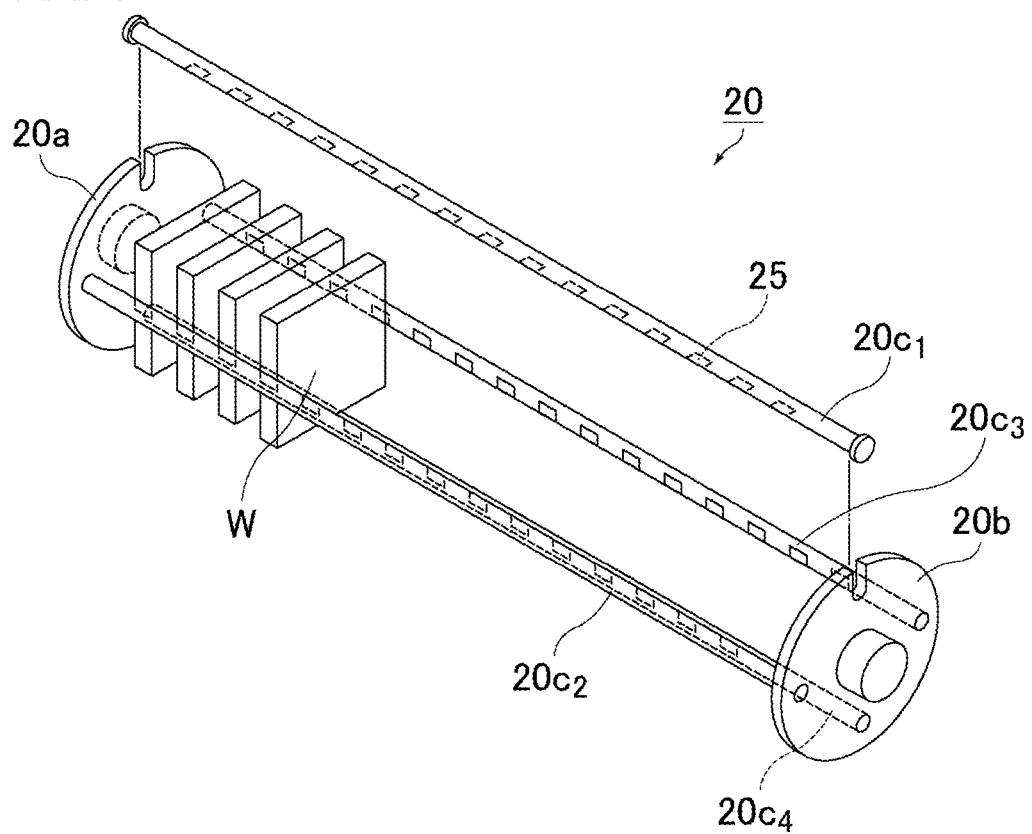
FIG. 3 is a schematic perspective view of an example of a workpiece holder holding workpieces.

FIG. 3 is a schematic perspective view of an example of a workpiece holder holding workpieces.

The workpiece holder 20 shown in FIG. 3 includes a pair of support plates 20a and 20b and multiple support posts $20c_1$, $20c_2$, $20c_3$, and $20c_4$ coupled to the support plates 20a and 20b. The support posts $20c_1$, $20c_2$, $20c_3$, and $20c_4$ each include multiple grooves 25 to hold the workpieces W. The workpieces W are held with their main surfaces oriented vertically. The support post $20c_1$ is removable.

In the film-forming device of the present invention, the position of a heater is not limited as long as the heater can heat the inside of the chamber. Yet, preferably, the heater is attached to an outer wall of the inner chamber. In particular, preferably, the heater is removably attached to the outer wall of the inner chamber.

The temperature in the inner chamber is stabilized by the heater attached to the outer wall of the inner chamber, which enables uniform deposition. In particular, when the heater is removable, it makes maintenance easy.

Figure 4:
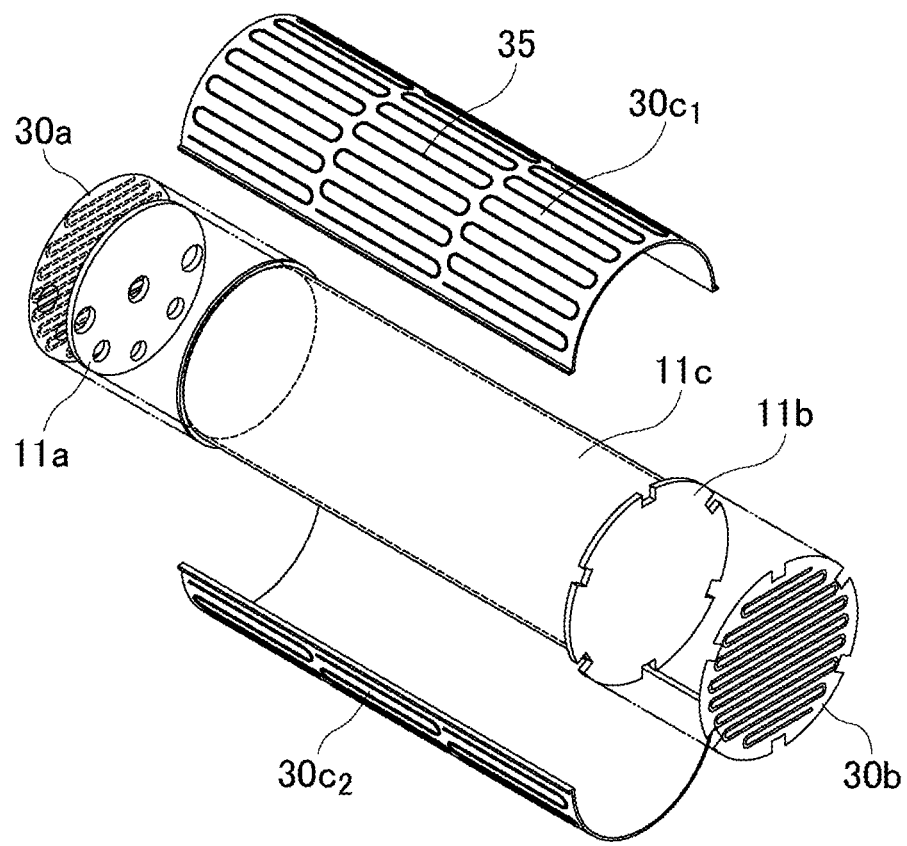
FIG. 4 is a schematic perspective view of an example of a heater to be attached to an outer wall of an inner chamber.

FIG. 4 is a schematic perspective view of an example of the heater to be attached to the outer wall of the inner chamber.

In FIG. 4, a heater $30a$ is attached to cover the outer wall of the first lid $11a$ of the inner chamber; a heater $30b$ is attached to cover the outer wall of the second lid $11b$ of the inner chamber; and heaters $30c_1$ and $30c_2$ are attached to cover the outer wall of the chamber body $11c$ of the inner chamber. The heaters $30c_1$ and $30c_2$ each include heater wires 35 in three separate blocks, i.e., the center and ends thereof when viewed in the longitudinal direction of the chamber body $11c$. These blocks are separately controllable.

Preferably, the film-forming device of the present invention further includes a gas supply mechanism that supplies various gases to the inner chamber. In particular, preferably, the film-forming device further includes gas supply pipes that supply various gases to the inner chamber, such as the gas supply pipe group 40 shown in FIG. 2. Each gas supply pipe usually includes multiple gas outlets.

In FIG. 2, the gas supply pipe group 40 is connected to the first lid $11a$ of the inner chamber 11. The gas supply pipe group 40 is not connected to the second lid $11b$ of the inner chamber 11, and is thus cantilever-supported by the first lid $11a$.

Examples of the gas supply pipes include the following three types: a deposition material supply pipe, a modifier supply pipe, and a carrier gas supply pipe.

There are no limitations as to how many of which types of gas supply pipes are included in the gas supply pipe group 40 shown in FIG. 2. Yet, preferably, the number of the carrier gas supply pipes is the largest.

In deposition by ALD, the deposition material supply pipe is a gas supply pipe that supplies a gas containing a deposition material that is a precursor of a compound to be deposited.

ALD can deposit metal oxides such as alumina ($Al_2O_3$) and silica ($SiO_2$); metal nitrides such as titanium nitride (TiN); and metals such as platinum (Pt).

Examples of the deposition material include trimethylaluminum (TMA: $Al(CH_3)_3$) to deposit alumina, trisdimethylaminosilane ($SiH[N(CH_3)_2]_3$) to deposit silica, titanium tetrachloride ($TiCl_4$) to deposit titanium nitride, and (trimethyl)methylcyclopentadienyl platinum ($MeCpPtMe_3$) to deposit platinum.

Preferably, a carrier gas is also supplied with the deposition material through the deposition material supply pipe.

In this case, preferably, a mixed gas of the deposition material and a carrier gas is prepared outside the film-forming device, and the mixed gas is supplied into the chamber through the deposition material supply pipe.

In deposition by ALD, the modifier supply pipe is a gas supply pipe that supplies a gas as a modifier that modifies a precursor of a compound to be deposited in order to obtain a compound to be deposited.

Examples of the gas as a modifier include ozone, oxygen, water (steam), and ammonia.

In the case of alumina deposition, alumina can be deposited on workpieces by using TMA as a precursor and using ozone gas or water as a modifier.

In the case of silica deposition, silica can be deposited on workpieces by using trisdimethylaminosilane as a precursor and using ozone gas as a modifier.

In the case of titanium nitride deposition, titanium nitride can be deposited on workpieces by using titanium tetrachloride as a precursor and using ammonia gas as a modifier.

In the case of platinum deposition, platinum can be deposited on workpieces by using $MeCpPtMe_3$ as a precursor and using oxygen gas as a modifier.

Preferably, a carrier gas is also supplied with the modifier through the modifier supply pipe.

In this case, preferably, a mixed gas of the modifier and a carrier gas is prepared outside the film-forming device, and the mixed gas is supplied into the chamber through the modifier supply pipe.

In deposition by ALD, the carrier gas supply pipe is a gas supply pipe that supplies a carrier gas as a purge gas after a deposition material is accumulated on the workpieces, and as a purge gas after a compound to be deposited is accumulated on the workpieces by a reaction of a modifier with the deposition material.

Examples of the carrier gas include inert gases such as nitrogen gas and argon gas.

Preferably, the same type of carrier gas as the carrier gas supplied through the carrier gas supply pipe is introduced into the deposition material supply pipe and the modifier supply pipe. Preferably, the carrier gas is constantly introduced through the three types of gas supply pipes.

Clogging of the gas supply pipes by the deposition material or the modifier can be prevented by constantly introducing the carrier gas through the three types of gas supply pipes.

Preferably, the film-forming device of the present invention further includes an exhaust mechanism that exhausts gas from the inner chamber and gas from the outer chamber separately. In particular, preferably, the film-forming device further includes an exhaust pipe that exhausts gas in the inner chamber, such as the exhaust pipe 50 shown in FIG. 2. Usually, the exhaust pipe includes multiple air inlets, and is connected to an exhaust device such as a vacuum pump at an end (located outside of the chamber) of the pipe so that gases in the inner chamber can be exhausted.

In FIG. 2, the exhaust pipe 50 is connected to the first lid $11a$ of the inner chamber 11. The exhaust pipe 50 is not connected to the second lid $11b$ of the inner chamber 11, and is thus cantilever-supported by the first lid $11a$.

Preferably, gases supplied into the chamber through the gas supply pipes are retained on the workpieces and then flow into the exhaust pipe. Thus, although not shown in FIG. 1 and FIG. 2, preferably, the film-forming device of the present invention further includes a flow direction regulator that changes the direction of gas flow from the gas supply pipes such that the gas flow is directed to the exhaust pipes.

Preferably, the film-forming device of the present invention further includes a rotation mechanism to rotate the workpiece holder, such as the rotation mechanism 60 shown in FIG. 2. When the workpiece holder aligns and holds the workpieces in multiple stages such that the main surfaces of the workpieces are oriented vertically, the rotation mechanism includes a horizontal rotation axis. For example, a motor or the like can be used to rotate the workpiece holder.

Rotating the workpiece holder in the chamber allows the gases in the chamber to flow uniformly, so that films deposited on the main surfaces of the workpieces W can have a uniform thickness.

In FIG. 2, the rotation mechanism 60 is provided on the first lid 11a of the inner chamber 11, and is capable of rotating the workpiece holder 20 cantilever-supported by the first lid 11a.

In the film-forming device of the present invention, preferably, the chamber is further pivotable horizontally.

When the chamber is pivotable horizontally, the direction of the chamber can be changed to a position suitable for work, which makes maintenance easy.

Figure 5:
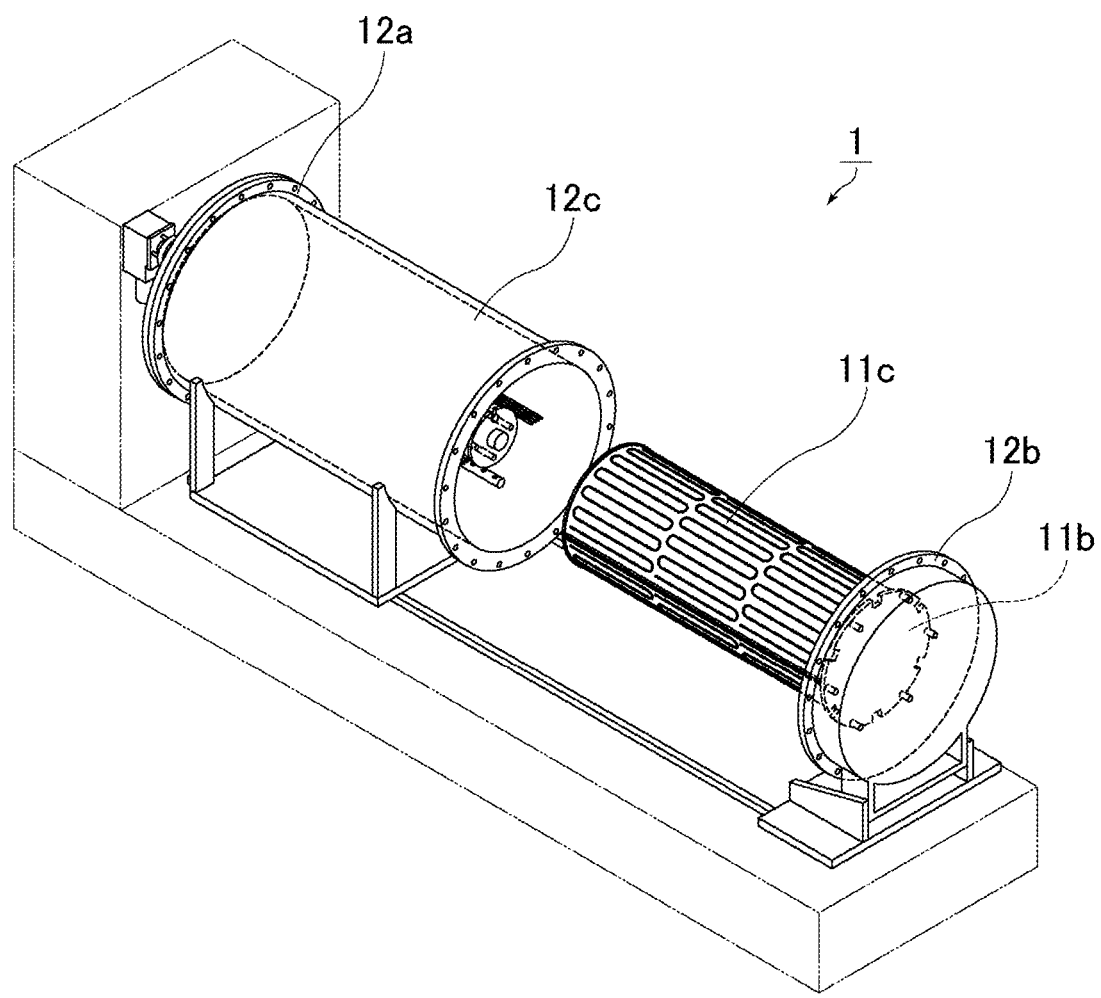
FIG. 5 is a perspective view of a state in which the inner chamber is moved horizontally in the film-forming device shown in FIG. 1.

FIG. 5 is a perspective view of a state in which the inner chamber is moved horizontally in the film-forming device shown in FIG. 1.

In FIG. 5, the second lid 11b and the chamber body 11c of the inner chamber are moved horizontally along with the second lid 12b of the outer chamber. In contrast, the first lid 11a (not shown) of the inner chamber and the first lid 12a and the chamber body 12c of the outer chamber are fixed. In this case, only the inner chamber is considered to be moved horizontally.

Figure 6:
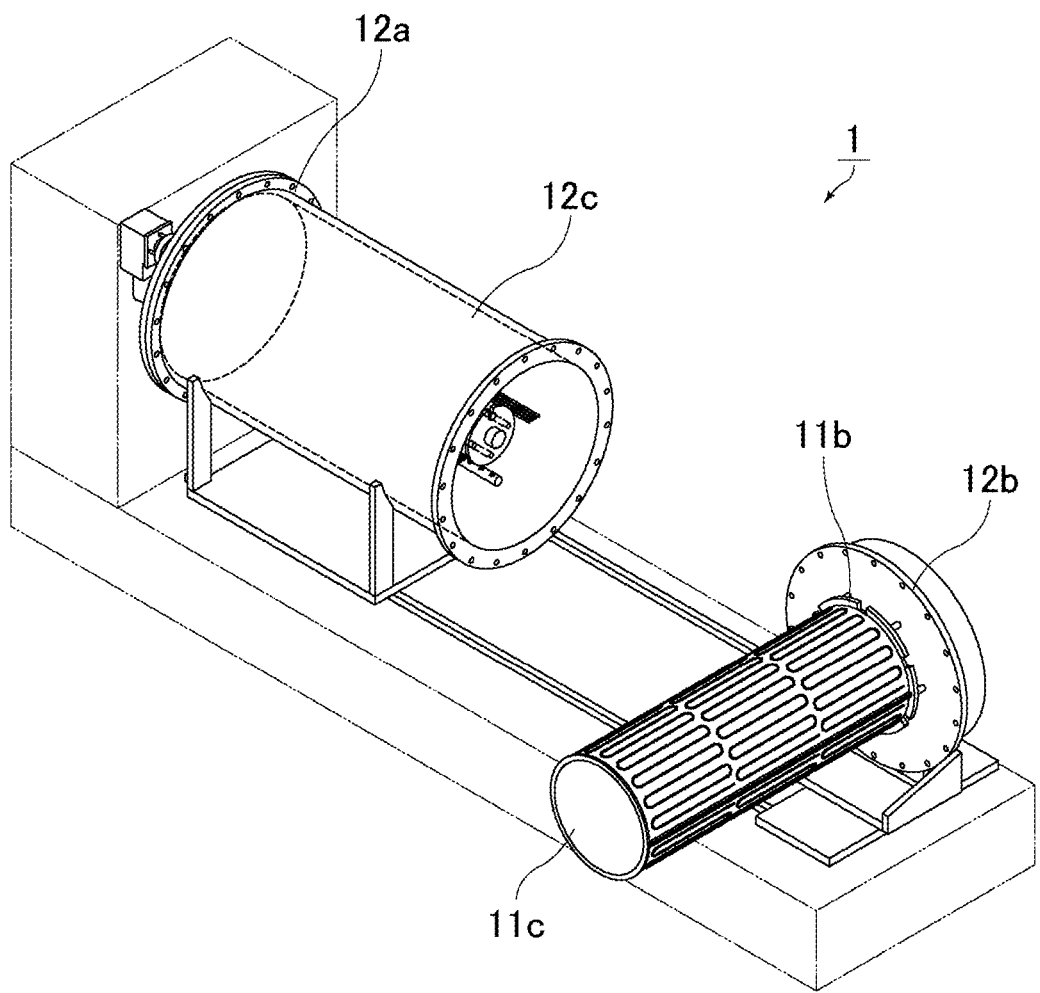
FIG. 6 is a perspective view of a state in which the inner chamber is pivoted horizontally in the film-forming device shown in FIG. 1.

FIG. 6 is a perspective view of a state in which the inner chamber is pivoted horizontally in the film-forming device shown in FIG. 1.

In FIG. 6, the second lid 11b and the chamber body 11c in the inner chamber are pivoted horizontally along with the second lid 12b of the outer chamber. In this case, only the inner chamber is considered to be pivoted horizontally.

In the film-forming device of the present invention, when the chamber is pivotable horizontally, the pivot angle is not limited, but is preferably 70 degrees to 110 degrees in order to make maintenance easy.

The following describes how to use the film-forming device of the present invention, separately for deposition and for maintenance.

Before describing deposition using the film-forming device of the present invention, a deposition method by ALD is described.

According to the deposition method by ALD, workpieces are set in a chamber capable of maintaining a vacuum, and the vacuum is maintained in the chamber. In this state, the method includes supplying a deposition material into the chamber and supplying a modifier into the chamber. The method repeats these steps several times to form a reaction film on each workpiece.

The following shows an example of a deposition process using the film-forming device of the present invention.

1. The chamber is moved horizontally by the motor and the guide and opened.
2. The workpiece holder in which workpieces are set in advance is placed in a position on the film-forming device so as to be placed in the chamber.
3. The chamber is moved horizontally back to the original position and closed.
4. A vacuum is created in the chamber.
5. The inside of the chamber is heated by the heater.
6. When a predetermined pressure is reached in the chamber, a gas containing a deposition material and a gas containing a modifier are alternately introduced into the chamber.
7. Gas supply is repeated until a predetermined film is formed.
8. Heating in the chamber is stopped.
9. The chamber is vented to atmosphere.
10. The chamber is moved horizontally by the motor and the guide and opened.
11. The workpiece holder is removed.

The following shows an example of a maintenance process of the film-forming device of the present invention.

1. Only the inner chamber is moved horizontally by the motor and the guide, while the outer chamber is left unmoved.
2. Maintenance is performed on the outer chamber and/or the inner chamber.
3. When the inner chamber is pivotable, it makes maintenance easy. When the heater is removably attached to the outer wall of the inner chamber, it makes maintenance even easier.

The film-forming device of the present invention is not limited to the above preferred embodiments. Various modifications and changes can be made to the structure and the like of the film-forming device without departing from the gist of the present invention.

In the film-forming device of the present invention, preferably, the inner chamber and the outer chamber are separately movable horizontally. For example, the inner chamber and the outer chamber may move horizontally together, or only the inner chamber may move horizontally.

In the film-forming device of the present invention, when the chamber is horizontally pivotable, preferably, the inner chamber and the outer chamber are separately pivotable horizontally. For example, the inner chamber and the outer chamber may pivot horizontally together, or only the inner chamber may pivot horizontally.

REFERENCE SIGNS LIST 1 film-forming device
10 chamber
11 inner chamber
11a first lid of inner chamber
11b second lid of inner chamber
11c chamber body of inner chamber
12 outer chamber
12a first lid of outer chamber
12b second lid of outer chamber
12c chamber body of outer chamber
13 guide
20 workpiece holder
20a, 20b support plate
$20c_1, 20c_2, 20c_3, 20c_4$ support post
25 groove
30, 30a, 30b, $30c_1, 30c_2$ heater
35 heater wire
40 gas supply pipe group
50 exhaust pipe
60 rotation mechanism
W workpiece

The invention claimed is:

1. A film-forming device based on atomic layer deposition, the film-forming device comprising:
a chamber having a horizontal central axis, capable of maintaining a vacuum, and movable along the horizontal central axis, the chamber including an inner chamber and an outer chamber that houses the inner chamber;
a workpiece holder that aligns and holds workpieces to be processed in multiple stages in the inner chamber; and
a heater that heats an inside of the chamber,
wherein the outer chamber includes a first outer lid removably connected to the outer chamber and defining a first outer chamber side wall, and a second outer lid removably connected to the outer chamber and defining a second outer chamber side wall opposite to the first outer lid along the horizontal central axis, wherein the inner chamber includes a first inner lid removably connected to the inner chamber and defining a first inner chamber side wall, and a second inner lid removably connected to the inner chamber and defining a second inner chamber side wall opposite to the first inner lid along the horizontal central axis, the workpiece holder has a first end and a second end opposite the first end, the first inner lid directly cantilever-supports the first end of the workpiece holder, and the second inner lid is not directly connected to the second end of the workpiece holder during deposition, and the inner chamber and the outer chamber are separately moveable horizontally relative to the workpiece holder and the first inner lid when the first inner lid is directly cantilever-supporting the first end of the workpiece holder.

2. The film-forming device according to claim 1, wherein a pressure in the outer chamber is higher than a pressure in the inner chamber during the deposition.

3. The film-forming device according to claim 1, wherein the workpiece holder aligns and holds the workpieces in multiple stages such that main surfaces of the workpieces are oriented in a vertical direction relative to the horizontal central axis of the chamber.

4. The film-forming device according to claim 1, wherein the workpiece holder is constructed so as to be removably placed into and out of the inner chamber.

5. The film-forming device according to claim 1, wherein the heater is attached to an outer wall of the inner chamber.

6. The film-forming device according to claim 5, wherein the heater is removably attached to the outer wall of the inner chamber.

7. The film-forming device according to claim 1, wherein the inner chamber is separately removable from the outer chamber, and is further horizontally pivotable relative to the outer chamber when separated therefrom.

8. The film-forming device according to claim 1, further comprising a gas supply pipe group that supplies various gases into the chamber.

9. The film-forming device according to claim 8, further comprising an exhaust pipe that exhausts gas from the chamber.

10. The film-forming device according to claim 1, wherein the workpiece holder is constructed so as to be rotatable within in the inner chamber.

11. The film-forming device according to claim 1, further comprising a guide upon which the chamber is movable horizontally.

12. The film-forming device according to claim 1, wherein the chamber is a cylindrical body.

* * * * *